(12) United States Patent
Burbank et al.

(10) Patent No.: US 7,808,744 B2
(45) Date of Patent: Oct. 5, 2010

(54) APPARATUS INCLUDING A DIELECTRIC MIRROR AND METHOD OF REFLECTING RADIATION AWAY FROM A PORTION OF AN APPARATUS

(75) Inventors: Daniel Paul Burbank, Minneapolis, MN (US); Michael Christopher Kautzky, Eagan, MN (US); Michael Allan Krosch, Savage, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 1547 days.

(21) Appl. No.: 11/077,757

(22) Filed: Mar. 11, 2005

(65) Prior Publication Data

US 2006/0203388 A1   Sep. 14, 2006

(51) Int. Cl.
*G11B 21/20* (2006.01)
(52) U.S. Cl. .................................................. 360/234.6
(58) Field of Classification Search ........................ None
See application file for complete search history.

(56) References Cited

U.S. PATENT DOCUMENTS

| 3,942,880 | A |   | 3/1976  | Zeiders, Jr. |
| 4,039,962 | A |   | 8/1977  | Hughes |
| 4,142,006 | A |   | 2/1979  | Choyke et al. |
| 4,175,835 | A |   | 11/1979 | Kuhn, Jr. |
| 4,214,818 | A |   | 7/1980  | Choyke et al. |
| 4,314,742 | A |   | 2/1982  | Dye et al. |
| 4,633,476 | A | * | 12/1986 | Scifres et al. ............ 372/45.01 |
| 5,579,333 | A |   | 11/1996 | Neil et al. |
| 2004/0027725 | A1 |   | 2/2004 | Pan et al. |
| 2008/0002281 | A1 | * | 1/2008 | Hasegawa ................ 360/77.03 |

FOREIGN PATENT DOCUMENTS

JP             2002045962 A  *  2/2002

* cited by examiner

*Primary Examiner*—David D Davis
(74) *Attorney, Agent, or Firm*—Kinney & Lange, P.A.

(57) ABSTRACT

An apparatus includes a base layer, a bonding layer subject to laser radiation, and an insulating layer positioned between the base layer and bonding layer. The insulating layer includes a dielectric mirror, which is capable of reflecting laser radiation away from the base layer.

12 Claims, 5 Drawing Sheets

APPARATUS INCLUDING A DIELECTRIC MIRROR AND METHOD OF REFLECTING RADIATION AWAY FROM A PORTION OF AN APPARATUS

CROSS-REFERENCE TO RELATED APPLICATION(S)

None.

BACKGROUND OF THE INVENTION

The present invention relates to a dielectric mirror for reflecting laser radiation away from a portion of an apparatus. For example, the dielectric mirror may be included in a slider overcoat to help reduce damage to the slider during a laser bonding process for electrically connecting bond pads of the slider to interconnect traces of a gimbal and actuator arm of a disc drive suspension assembly.

A magnetic read/write head ("magnetic transducer") of a magnetic data storage and retrieval system is typically fabricated in a large array of identical devices on a surface of a ceramic wafer. The finished array of magnetic transducers is embedded in a layer of an insulating material, which is often called an insulating layer or an overcoat. A hard, transparent aluminum oxide material is often used as the insulating material. The wafer is cut and machined to create thousands of magnetic transducers. The ceramic block associated with each magnetic transducer is often called a slider. In addition to a magnetic transducer, the slider often has bond pads (also known as "electrical contact pads"), where the bond pads are used to electrically connect the magnetic transducer to read and write circuitry of a disc drive.

Air bearing sliders have been extensively used in disc drives to position a magnetic transducer above a rotating disc. Conventionally, head positioning is accomplished by operating an actuator arm with a large-scale actuation motor, such as a voice coil motor ("VCM"), to radially position the slider over a track on the disc. A typical disc drive system may include a suspension assembly attached to the actuator arm for supporting and positioning the slider. The suspension assembly includes a load beam attached to the actuator arm and a gimbal disposed at an opposite end of the load beam. This type of suspension assembly may be used with both magnetic and nonmagnetic discs. The slider may then be attached to the gimbal and actuator arm to form a head gimbal assembly ("HGA"). The VCM rotates the actuator arm and the suspension assembly to position the magnetic transducer over a desired radial track of the disc.

In order for the disc drive to read and write data from the magnetic transducer, read and write circuitry of the disc drive must be able to communicate with the slider. Typically, the HGA serves to electrically connect the magnetic transducer to an electronics module within the disc drive. Interconnect traces, which may be located on a flexible printed circuit or formed directly on the gimbal and actuator arm, are electrically connected to bond pads of a slider. Difficulties may arise in making the electrical connection because a heat source used in the connection process may cause damage to the slider.

Thermal interconnect ("TIC") bonding can be used to connect a slider bond pad to its respective HGA interconnect trace. In TIC bonding, a ball of molten solder is ejected from a capillary on a trajectory that intercepts an intended point of attachment between the slider bond pad and its respective HGA interconnect trace. An infrared laser operating at a wavelength of approximately 1.08 micrometers (μm) may be used as a heating source for the TIC bonding process. If a laser is used, the laser beam is directed at a 45 degree angle to the bond pad surface of the slider and the interconnect trace. Ideally, the laser beam irradiates only the solder and the bond pad and interconnect trace surfaces. In practice, however, the laser beam irradiates areas of the slider bond pad surface that are not covered by a bond pad ("incident radiation"). As a result, the slider may absorb incident laser radiation, which may then cause damage to the slider.

Similar problems may arise when a portion of an apparatus requires exposure to laser radiation while another portion of an apparatus may be damaged by the laser radiation.

BRIEF SUMMARY OF THE INVENTION

In a first aspect, the present invention is an apparatus including a base layer, a bonding layer subject to laser radiation, and an insulating layer positioned between the base layer and bonding layer. The insulating layer includes a dielectric mirror capable of reflecting laser radiation away from the base layer.

In a second aspect, the present invention is an apparatus including a magnetic transducer and a suspension assembly. The magnetic transducer is embedded in an insulating layer, and an electrical contact pad is electrically coupled to the magnetic transducer. The insulating layer includes a dielectric mirror. The suspension assembly has an interconnect trace, where the electrical contact is electrically connected to the interconnect trace of the suspension assembly.

In a third aspect, the present invention is a method of reflecting laser radiation away from an apparatus that is subject to laser radiation. The method includes the steps of forming a dielectric mirror on a first portion of the apparatus and directing laser radiation at a second portion of the apparatus, where the second portion is adjacent the first portion.

The above summary of the present invention is not intended to describe each disclosed embodiment or every implementation of the present invention. The figures and the detailed description which follow more particularly exemplify illustrative embodiments.

While some of the above-identified figures set forth one or more embodiments of the invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. It should also be understood that the above-identified figures are not drawn to scale.

DETAILED DESCRIPTION

The present invention makes use of a dielectric mirror positioned to protect an area (or "portion") of an apparatus that is capable of being damaged by a laser beam. An apparatus may be, for example, any piece of a disc drive, magnetic memory device, or integrated circuit. However, the dielectric mirror may be used in conjunction with any apparatus where it is preferred that only a selected portion of the apparatus be exposed to a laser beam, such as a process that requires selective heating of an apparatus using a laser. In the present invention, a dielectric mirror is formed of alternating layers of dielectric materials having high and low indices of refraction. Whether a first layer of the dielectric mirror has a high or low index of refraction may depend upon the application of the dielectric mirror. Each layer is deposited to be one-quarter wavelength in optical thickness at a selected laser frequency (or wavelength) and a selected angle of incidence. The optical thickness will depend upon an index of refraction of a material forming the layer and the laser's wavelength. The angle of incidence is the angle the laser beam is directed at the apparatus.

In an exemplary embodiment discussed below, the dielectric mirror may be incorporated into an insulating layer of a slider, where a magnetic transducer is embedded in the insulating layer, and where the slider is part of a head gimbal assembly of a magnetic storage and retrieval system. FIGS. 1-5 are used to describe how a slider is connected to a gimbal and arm, and the problems that may arise during a laser bonding process for electrically connecting a bond pad of the slider to an interconnect trace of the gimbal and arm.

Figure 1:
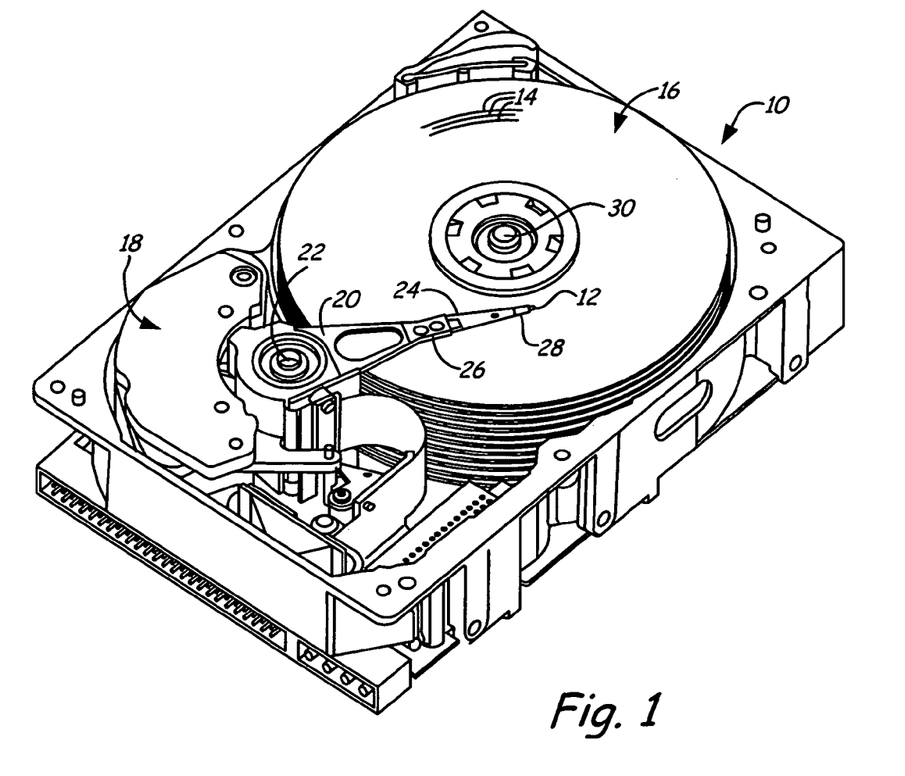
FIG. 1 is a perspective view of a typical disc drive including an actuation system for positioning a slider over a track of a magnetic medium.

FIG. 1 is a perspective view of a typical disc drive 10 including an actuation system for positioning slider 12 over track 14 of magnetic medium 16. The particular configuration of disc drive 10 is shown for ease of describing the present invention and is not intended to limit the scope of the present invention in any way. Disc drive 10 includes a VCM 18 arranged to rotate an actuator arm 20 on a spindle around an axis 22. A load beam 24 is connected to actuator arm 20 at a head mounting block 26. A gimbal 28 is connected to an end of load beam 24 and slider 12 is attached to gimbal 28. Slider 12 carries a magnetic transducer (not shown in FIG. 1) for reading and/or writing data on concentric tracks 14 of magnetic medium 16. Magnetic medium 16 rotates around an axis 30, so that windage is encountered by slider 12 to keep it aloft a small distance above the surface of magnetic medium 16.

Figure 2:
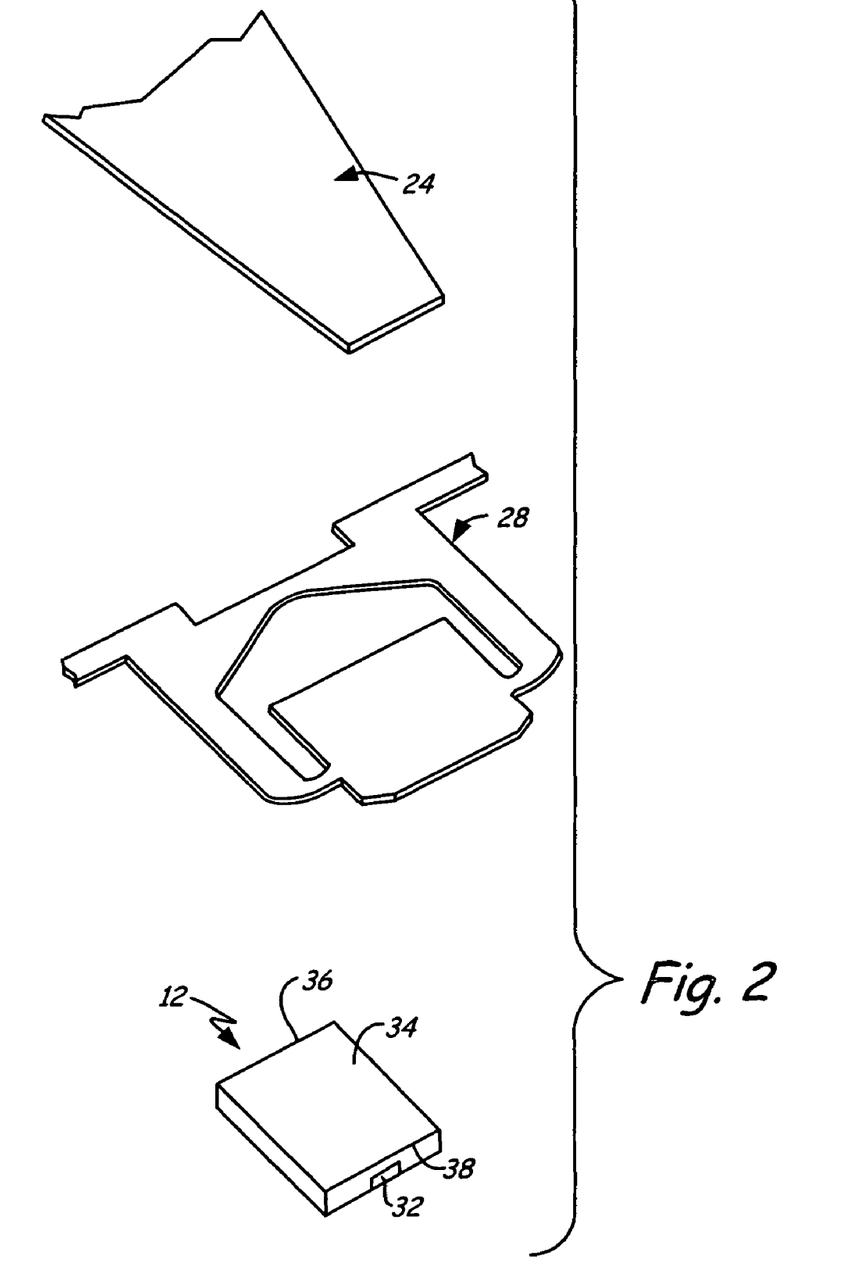
FIG. 2 is an exploded perspective view showing, from top to bottom, a load beam, a gimbal, and a slider carrying a magnetic transducer (or transducer).

FIG. 2 is an exploded perspective view showing, from top to bottom, load beam 24, gimbal 28, and slider 12 carrying magnetic transducer (or transducer) 32. The particular configurations of load beam 24, gimbal 28, and slider 12 are shown for ease of describing the present invention and are not intended to limit the scope of the present invention in any way. Gimbal 28 is attached to load beam 24 and slider 12 attaches to a bottom surface of gimbal 28. An adhesive or other means may be used to mechanically connect slider 12 to gimbal 28. Gimbal 28 provides a spring connection between slider 12 and load beam 24. Slider 12 includes a magnetic medium opposing face (not shown) and a gimbal opposing face 34, which is attached to a slider opposing face (not shown) on the bottom surface of gimbal 28. Slider 12 has a leading edge 36 and a trailing edge 38. Gimbal 28 is configured to allow slider 12 to move in pitch and roll directions to compensate for fluctuations in the spinning surface of magnetic medium 16 (shown in FIG. 1). Magnetic transducer 32 is located proximate to trailing edge 38 of slider 12. In operation, load beam 24 and gimbal 28 carrying slider 12 move together as positioning is performed by VCM 18 (shown in FIG. 1) to rotate actuator arm 20 (shown in FIG. 1).

Figure 3:
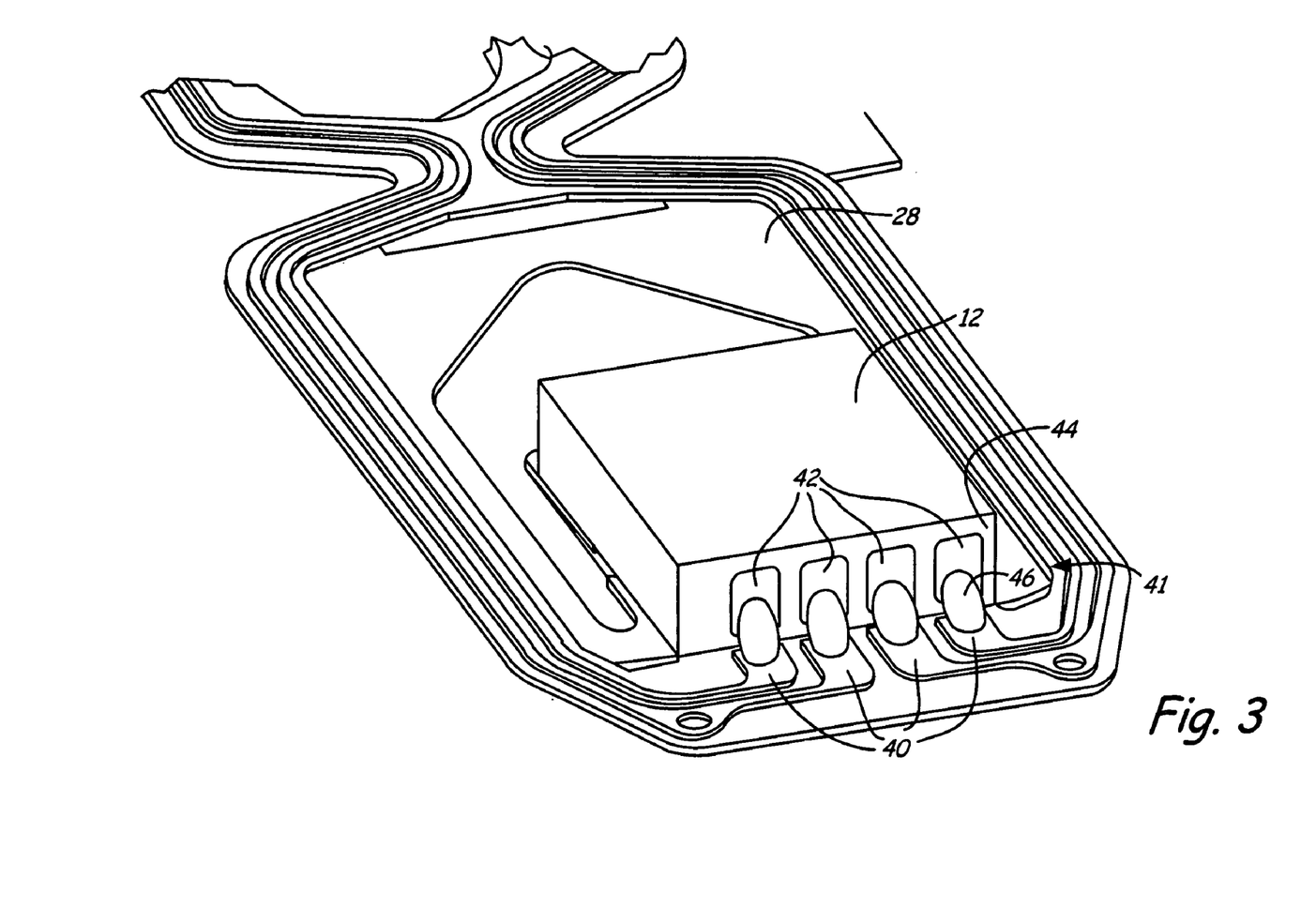
FIG. 3 is a bottom perspective view showing a slider attached to a gimbal.

FIG. 3 is a bottom perspective view showing slider 12 attached to gimbal 28. Gimbal interconnect traces 40 complete a circuit connection between the electronic components of the disc drive (not shown) and slider 12. Interconnect traces 40 are typically located on an underside of gimbal 28, and may also travel along an underside of actuator arm 20 and load beam 24 (both shown in FIG. 1). Interconnect traces 40 may be formed directly on gimbal 28 or on flexible printed circuit 41, which is disposed on the underside of gimbal 28. Slider bond pads 42 are located on face 44 of slider 12. Slider bond pads 42 connect to various components of magnetic transducer 32 (shown in FIG. 2). Both interconnect traces 40 and slider bond pads 42 may be formed of gold-plated copper, but they do not need to be formed of the same material. There may be more than one interconnect trace 40 per bond pad 42, but typically, each interconnect trace 40 corresponds to one bond pad 42. Bond pads 42 are bonded to their respective interconnect traces by solder balls 46. Solder ball 46 acts as an electrical conduit and completes an electrical connection between slider 12 and interconnect trace 40.

Figure 4:
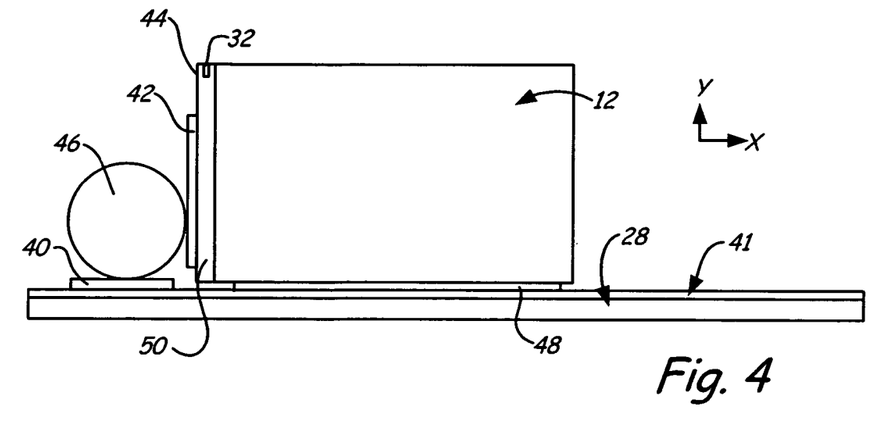
FIG. 4 is a side view of the distal end of the disc drive actuation assembly of FIG. 1.

FIG. 4 is a side view of the distal end of disc drive 10 actuation assembly of FIG. 1. In the embodiment shown in FIG. 4, flexible printed circuit 41 is formed on gimbal 28, and interconnect trace 40 is formed on flexible printed circuit 41. However, those aspects of disc drive 10 actuation assembly are not pertinent to the present invention. Slider 12 is mechanically bonded to gimbal 28 by adhesive 48. However, any process known in the art may be used to mechanically bond slider 12 to gimbal 28. As FIG. 4 shows, solder ball 46 contacts both interconnect trace 40 and slider bond pad 42 in order to complete the electrical connection. An example of a solder ball material that may be used is eutectic tin lead alloy. A solder ball connection is typically used to electrically connect interconnect trace 40 and slider bond pad 42.

Magnetic transducer 32 is embedded in insulating layer 50 (or "overcoat"). Slider bond pad 42 may also be embedded in insulating layer 50. Insulating layer 50 typically has a thickness of about 20 μm to about 25 μm. Magnetic transducer 32 is not typically exposed on a side surface of slider 12, but is usually embedded in insulating layer 50. However, for purposes of illustrating the approximate location of magnetic transducer 32, magnetic transducer 32 is shown in FIG. 4 to be exposed at a side surface of slider 12. Insulating layer 50 may be formed by any electrically insulating material. In the present invention, insulating layer 50 includes a dielectric mirror (shown in FIG. 6), which helps to decrease damage to slider 12 during a bonding process. Insulating layer 50 electrically insulates magnetic transducer 32. Magnetic transducer 32 is placed at a trailing end of slider 12.

Figure 5:
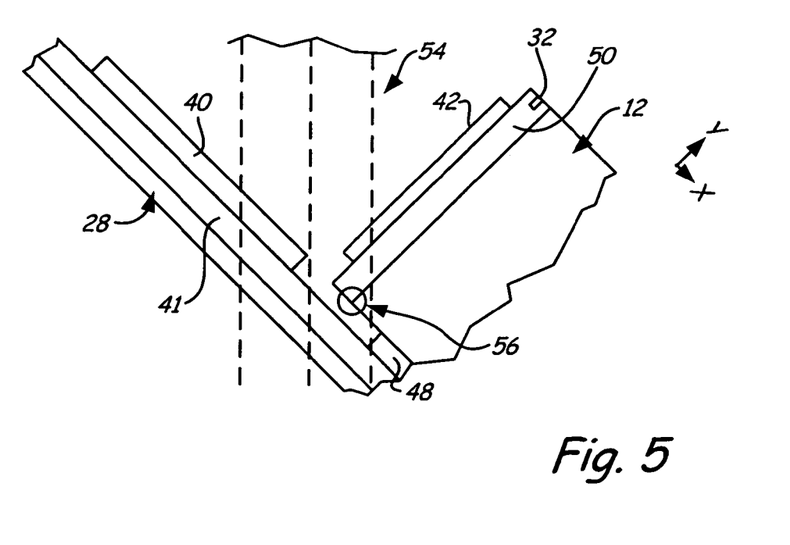
FIG. 5 is a side view of the distal end of the disc drive actuation assembly of FIG. 1, where the view is tilted about 45°, and is used to demonstrate where an infrared laser beam may impinge on the slider during a bonding process.

FIG. 5 is a side view of the distal end of disc drive 10 actuation assembly of FIG. 1, where the view is tilted about 45°, and is used to demonstrate where infrared laser beam 54 may impinge on slider 12 during a bonding process. TIC bonding is one type of a solder ball bonding process. In TIC bonding, a ball of molten solder is ejected from a capillary on a trajectory that intercepts slider bond pad 42 and its respective interconnect trace 40. Infrared laser beam 54 operating at a wavelength of approximately 1.08 μm is used as a heating source. Laser beam 54 is directed at approximately a 45° angle to slider bond pad 42 surface.

One of the problems that may arise with TIC bonding and with other bonding processes using lasers is that laser beam 54 may irradiate areas on slider 12 that are not covered by slider bond pad 42. Slider 12 is typically formed of a ceramic substrate such as aluminum oxide-titanium carbide, which absorbs radiation of laser beam 54. Other slider 12 materials may also absorb laser beam 54. When slider 12 absorbs laser beam 54, localized heating of slider 12 may cause damage in the form of melting, cracking, and/or undesired particle formation. A majority of the damage may occur in blowout region 56, which is an area of slider 12 not covered by bond pad 42. Although insulating layer 50 is positioned between laser beam 54 and slider 12, insulating layer 50 is typically formed of a material that it is transparent to laser beam 54, and so laser beam 54 typically passes through insulating layer 50, and slider 12 absorbs incident laser beam 54. Thus, insulating layer 50 does little to protect slider 12 from damage due to laser beam 54.

The present invention addresses the problem of damage to slider 12 due to incident laser radiation by including a dielectric mirror in insulating layer 50. The dielectric mirror may be formed of multiple bilayer repeats, where a bilayer is formed of a thin film layer having a low index of refraction ("low index layer") and a thin film layer having a high index of infraction ("high index layer"). Every time a laser beam passes from one layer to the next, some of the beam is reflected. By stacking the bilayers, the percentage of the beam that is reflected can be increased. In general, the dielectric mirror should be positioned so that it blocks/reflects laser beam 54 from reaching slider 12, which is highly absorbent of laser beam 54 irradiation. Although insulating layer 50 may be formed solely of the dielectric mirror, it is time consuming to form a dielectric mirror having a thickness of about 20 μm to about 25 μm. Thus, it may be preferred that only a part of insulating layer 50 is a dielectric mirror.

For purposes of illustrating a preferred placement of the dielectric mirror, x and y coordinates are shown in FIGS. 4 and 5. In an x-direction, the dielectric mirror may be placed anywhere in insulating layer 50, and does not necessarily need to be close to slider 12. For example, a thick layer of a conventional insulating dielectric material such as $Al_2O_3$ (also known as "alumina") may be deposited on slider 12 before depositing the layers of the dielectric mirror, or the dielectric mirror layers may be deposited prior to depositing the conventional insulating material. In a y-direction, it is preferred that the dielectric mirror substantially cover the areas of slider 12 that are expected to be irradiated by laser beam 54. Namely, the edge of slider bond pad 42 and the edge of the dielectric mirror should be abutting or very close to one another. The dielectric mirror reflects laser beam 54 incident on portions of insulating layer 50 and slider 12 that are not covered by slider bond pad 42 (i.e., incident radiation). In this way, the present invention helps to prevent damage to slider 12 by reflecting incident radiation from laser beam 54 that would normally be absorbed by slider 12. It is preferred that close to 100% of incident radiation is reflected, thus, it is important that the dielectric mirror not absorb a substantial amount of incident radiation.

Figure 6:
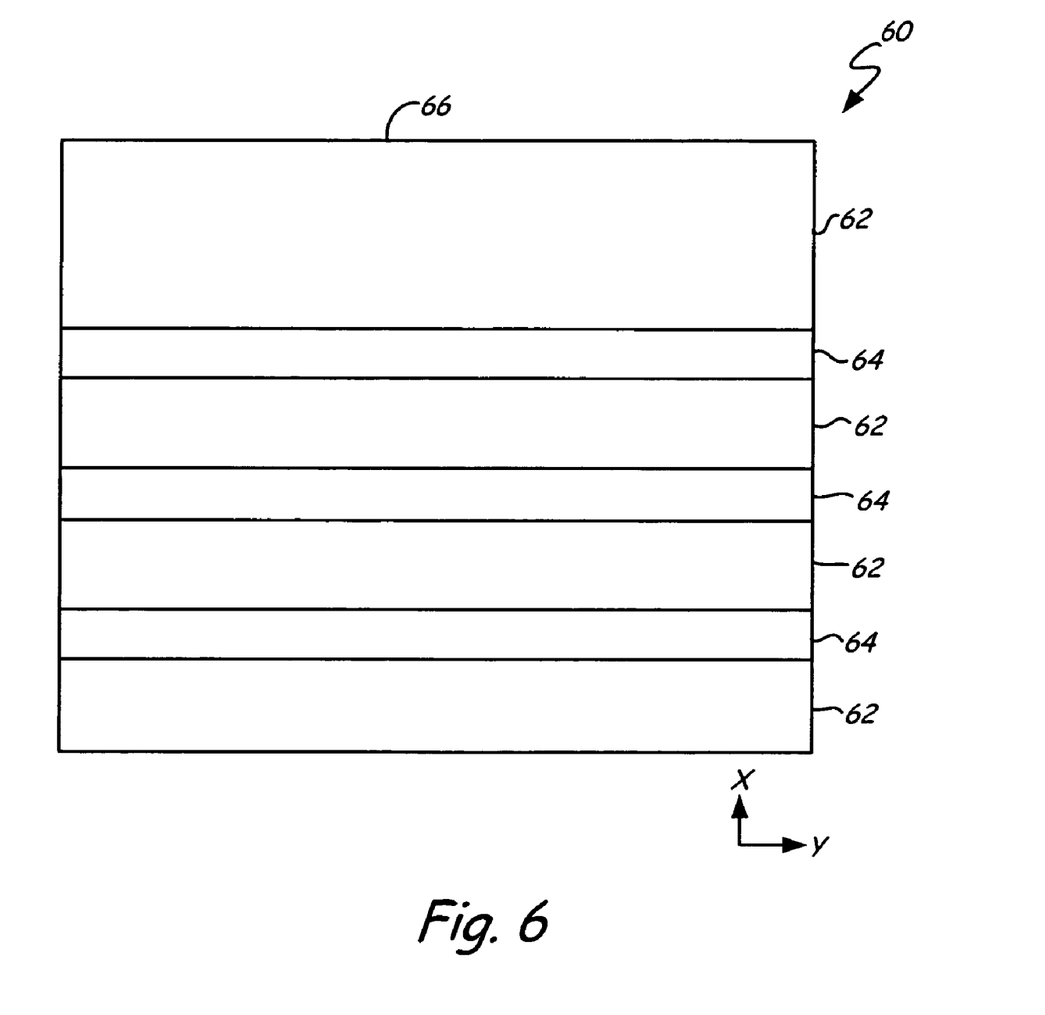
FIG. 6 is an exemplary embodiment of a multilayer dielectric mirror for use in the present invention.

FIG. 6 is an exemplary embodiment of multilayer dielectric mirror 60 for use in the present invention. Dielectric mirror 60 includes low index layer 62, which is formed of sputtered aluminum oxide ($Al_2O_3$), and high index layer 64, which is formed of silicon carbide (SiC). $Al_2O_3$ has an index of refraction (n) of approximately 1.6 ($n_L=1.6$) and SiC has an index of refraction of approximately 3.2 ($n_H=3.2$). Dielectric mirror 60 may also be formed of other suitable dielectric materials, such as silicon (having n=3.42), titanium dioxide (n=2.6 or 2.9), titanium oxide (n=2.4), tantalum oxide (n=2.09), hafnium oxide (n=2), zirconium oxide (n=1.96), silicon nitride (n=1.9), yttrium oxide (n=1.8), magnesium oxide (n=1.68), and silicon dioxide (n=1.46). The indices of refraction are measured at 550 nanometers (nm). Preferred material combinations besides SiC and $Al_2O_3$ include silicon and magnesium fluoride, SiC and silicon dioxide, and titanium oxide and $Al_2O_3$.

The higher a material's index of refraction, the slower light will travel through the material. In a preferred embodiment, dielectric mirror 60 is formed of five bilayer repeats of $Al_2O_3$ and SiC, for a total of ten layers. Each layer 62 and 64 is deposited to be about one-quarter wavelength in optical thickness. The optical thickness of each layer 62 and 64 will differ depending upon the wavelength of the laser beam being used and the indices of refraction of the materials forming layers 62 and 64. Specifically, a wavelength ($\lambda_{LAYER}$) within each layer 62 and 64 can be calculated using the following formula, where $\lambda_{LASER}$ is the wavelength of the laser beam and $n_{LAYER}$ is the index of refraction of the material used to form the particular layer:

$$\lambda_{LAYER} = \lambda_{LASER}/n_{LAYER}$$

Any method known in the art may be used to deposit layers 62 and 64, including, but not limited to, physical vapor deposition methods such as sputtering or atomic layer deposition (ALD). It is important that layers 62 and 64 are deposited substantially evenly, such that each layer is as flat as possible. Preferably, dielectric mirror 60 is deposited on a wafer level (i.e., before the wafer is sliced into individual magnetic transducers), after the magnetic transducers formed on the wafer are finished. Dielectric mirror 60 is essentially a part of insulating layer 50 (FIGS. 4 and 5), and so, dielectric mirror 60 may be deposited when conventional insulating layer 50 is deposited.

A normal angle of incidence ("normal") is 90° to surface 66 of dielectric mirror 60. The reflectance for N number of layers for a normal angle of incidence to surface 66 of dielectric mirror 60 may be calculated using the following formula:

$$\text{Reflectance} = [((-n_H/n_L)^N - (-n_L/n_H)^N)/((-n_H/n_L)^N + (-n_L/n_H)^N)]^2 \times 100$$

It is preferred that reflectance be close to 100%. However, a preferred percentage of reflectance may be adjusted according to how much incident laser beam slider 12 (FIGS. 2-5) may absorb before becoming damaged. Using SiC and $Al_2O_3$ as the materials in dielectric mirror 60 and a laser operating at a wavelength of about 1.08 μm, reflectance is about 99.6% for normal incidence. Dielectric mirror 60 only reflects light that strikes it from a limited range of angles ("incidence angles"). The range of incidence angles will depend upon many factors, including the type of dielectric materials used and the wavelength of the laser used. Dielectric mirror 60 formed of SiC and $Al_2O_3$ allows for high reflectivity over a broad range of incidence angles, where the range is preferably about normal to about 55° from normal. If a laser beam is directed at dielectric mirror 60 at an angle beyond the range of about normal to about 55° from normal, dielectric mirror 60 may still reflect some incident radiation, but reflectance will not be as high as when the incidence angle is between about 35° and about 55° from normal.

When dielectric mirror 60 is used to protect slider 12 from incident radiation during a laser bonding process used to bond interconnect trace 40 to slider bond pad 42, the angle of incidence to slider bond pad 42 surface is typically about 45° from normal (as shown in FIG. 5). In that situation, the angle of incidence within each layer can be calculated using Snell's Law: $n_1 \sin \theta_1 = n_2 \sin \theta_2$. Snell's law indicates that as light (such as from a laser) moves from a low index material to a high index material, the light bends towards the normal.

When a laser's angle of incidence to slider bond pad 42 surface is about 45°, the laser's angle of incidence within the $Al_2O_3$ layer is about 26.2° from normal and within the SiC layer is about 12.7° from normal. These angles of incidence are close enough to normal incidence such that reflectance is close to about 99.6% if dielectric mirror 60 has five bilayer repeats of $Al_2O_3$ layer 62 and SiC layer 64. Reflectivity would continue increasing as more bilayer repeats are added. This demonstrates that dielectric mirror 60 using alternating layers 62 and 64 of $Al_2O_3$ and SiC allows for high reflectivity over a broad range of incidence angles when used with a laser having a wavelength of about 1.08 µm because the angle of incidence within the layers will be close to a normal incidence.

Dielectric mirror 60 may be formed with dielectric materials that are compatible with the particular apparatus and/or manufacturing process being used. It is preferred that the materials have a deposition temperature within a range compatible with the apparatus and/or manufacturing process being used. It is also preferred that the dielectric materials have reproducible and predictable indices of refraction, chemical compatibility between adjacent layers so that the materials do not react and have a good layer-to-layer adhesion, acceptable stress and thermal stability to withstand any stress and temperature the apparatus may be exposed to, such as during operation of the device (or apparatus) if the apparatus is capable of operating and if the dielectric mirror remains in the device during operation of the device, matched coefficients of thermal expansion, and high individual layer deposition rates. It is also preferred that the two dielectric materials have a large difference in indices of refraction and low optical absorption at the wavelength of the laser beam used in order to reflect as much laser radiation as possible.

Dielectric mirror 60 may also be used as a protective coating for an apparatus in any manufacturing process that uses a laser. The apparatus may be protected on an individual basis or on a wafer-level, where dielectric mirror 60 may be formed on more than one apparatus. Dielectric mirror 60 may help to protect the apparatus from damage due to a laser beam by reflecting incident laser beam radiation. Besides the application of dielectric mirror 60 described in reference to FIGS. 2-6 above, dielectric mirror 60 may be used in conjunction with the other portions of a disc drive, other magnetic memory devices, such as a magnetoresistive memory device, or integrated circuits. For example, the present invention may be used with the invention described in U.S. patent application Ser. No. 10/763,834, entitled "ESD SHUNT FOR TRANSDUCING HEAD", when resistive elements of a shunt are removed by a procedure using a laser (e.g., laser trimming). In general, dielectric mirror 60 may be useful where it is preferred that only a selected portion of an apparatus be exposed to a laser beam.

When used in conjunction with an apparatus other than a slider of a disc drive, dielectric mirror 60 may be deposited using methods known in the art, including, but not limited to physical vapor deposition methods, such as sputtering or ALD. If necessary, an opening corresponding to the portion of the apparatus that needs to be selectively heated or otherwise exposed to the laser beam may then be patterned in dielectric mirror 60 using a method known in the art, such as a lithographic etching process. A laser beam may then be directed over the opening to selectively heat the portion of the apparatus exposed by the opening, while dielectric mirror 60 reflects incident laser radiation in order to protect the portions of the apparatus that may be damaged by the laser. In this way, dielectric mirror 60 may act as a protective mask. After the laser beam is directed at the portion of the apparatus requiring exposure, dielectric mirror 60 may be removed using a method known in the art, such as chemical mechanical polishing, or dielectric mirror 60 may be left on the apparatus.

The present invention is also a method of reflecting laser radiation away from an apparatus subject to laser radiation. For example, the method may be used in a manufacturing procedure using a laser (such as the laser bonding process discussed above). The apparatus may have a portion that is capable of being damaged by a laser beam (a "first" portion) and a portion that needs to be exposed to the laser beam (a "second" portion), where the first portion is adjacent (or otherwise near) the second portion. The method includes the steps of forming a dielectric mirror on the first portion of the apparatus. A laser beam may then be directed at the second portion of the apparatus. The dielectric mirror will reflect at least some of the laser beam away from the first portion. The method may also include patterning an opening in the dielectric mirror, as discussed above.

Although the present invention has been described with reference to preferred embodiments, workers skilled in the art will recognize that changes may be made in form and detail without departing from the spirit and scope of the invention.

We claim:

1. An apparatus comprising:
   a base layer;
   a bonding layer; and
   an insulating layer positioned between the base layer and bonding layer, wherein the bonding layer and the insulating layer are subject to incident laser radiation from an external source, the insulating layer including a dielectric minor positioned with respect to the base layer for reflecting the incident laser radiation away from the base layer, wherein the dielectric mirror is formed of alternating layers of a first thin film having a first index of refraction and a second thin film having a second index of refraction, wherein the first index of refraction is different that the second index of refraction.

2. The apparatus of claim 1, wherein the first and second thin films each have an optical thickness of about one-quarter wavelength of the laser radiation.

3. The apparatus of claim 1, wherein the first thin film is formed of silicon carbide.

4. The apparatus claim 1, wherein the second thin film is formed of aluminum oxide.

5. The apparatus of claim 1, wherein the apparatus is a part of a magnetic memory device.

6. The apparatus of claim 5, wherein the base layer is a slider.

7. An apparatus comprising:
   a transducer embedded in an insulating layer, and an electrical contact pad electrically coupled to the transducer, wherein the insulating layer includes a dielectric mirror; and
   a suspension assembly having an interconnect trace, wherein the electrical contact pad is electrically connected to the interconnect trace of the suspension assembly.

8. The apparatus of claim 7, wherein the dielectric minor is formed of alternating layers of a first thin film having a first index of refraction and a second thin film having a second index of refraction, wherein the first index of refraction is different than the second index of refraction.

9. The apparatus of claim 8, wherein the first thin film is formed of silicon carbide.

10. The apparatus of claim 8, wherein the second thin film is formed of aluminum oxide.

11. The apparatus of claim 8, wherein the first and second thin films each have an optical thickness of about one-quarter wavelength of a laser's radiation.

12. The apparatus of claim 7, wherein the dielectric minor is capable of reflecting laser radiation away from the transducer.

* * * * *

UNITED STATES PATENT AND TRADEMARK OFFICE
CERTIFICATE OF CORRECTION

| | | |
|---|---|---|
| PATENT NO. | : 7,808,744 B2 | Page 1 of 1 |
| APPLICATION NO. | : 11/077757 | |
| DATED | : October 5, 2010 | |
| INVENTOR(S) | : Burbank et al. | |

It is certified that error appears in the above-identified patent and that said Letters Patent is hereby corrected as shown below:

Col. 8, line 33
replace "minor"
with "mirror"

Col. 8, line 61
replace "minor"
with "mirror"

In Claim 12, col. 10, line 1
replace "minor"
with "mirror"

Signed and Sealed this
Thirteenth Day of September, 2011

David J. Kappos
*Director of the United States Patent and Trademark Office*